(12) United States Patent
Ohnishi (10) Patent No.: US 10,639,713 B2
(45) Date of Patent: May 5, 2020

(54) CONDUCTIVE FILLER, METHOD FOR MANUFACTURING CONDUCTIVE FILLER, AND CONDUCTIVE PASTE

(71) Applicant: SEKISUI CHEMICAL CO., LTD., Osaka, Osaka (JP)

(72) Inventor: Shigekatsu Ohnishi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 15/104,745

(22) PCT Filed: Mar. 3, 2015

(86) PCT No.: PCT/JP2015/056216
§ 371 (c)(1),
(2) Date: Jun. 15, 2016

(87) PCT Pub. No.: WO2015/133474
PCT Pub. Date: Sep. 11, 2015

(65) Prior Publication Data
US 2017/0216914 A1    Aug. 3, 2017

(30) Foreign Application Priority Data
Mar. 5, 2014   (JP) ................. 2014-042894

(51) Int. Cl.
*H01B 1/02*     (2006.01)
*C09D 5/24*     (2006.01)
(Continued)

(52) U.S. Cl.
CPC .............. *B22F 1/02* (2013.01); *B22F 1/0014* (2013.01); *B22F 1/0018* (2013.01);
(Continued)

(58) Field of Classification Search
CPC ........ B22F 1/02; B22F 1/0014; B22F 1/0018; B22F 1/0059; B22F 9/082; B22F 9/16;
(Continued)

(56) References Cited

U.S. PATENT DOCUMENTS

| 8,609,060 B1 | 12/2013 | Perry et al. |
| 2004/0139820 A1* | 7/2004 | Kodas ................. B01J 2/003 75/252 |

(Continued)

FOREIGN PATENT DOCUMENTS

| CN | 1750176 A | 3/2006 |
| EP | 3 029 686 A1 | 6/2016 |

(Continued)

OTHER PUBLICATIONS

Supplementary European Search Report for the Application No. EP 15 75 8124 dated Sep. 22, 2017.

(Continued)

*Primary Examiner* — Mark Kopec
(74) *Attorney, Agent, or Firm* — Cheng Law Group, PLLC (57) ABSTRACT

There is provided conductive paste excellent in electro-conductivity and thermal conductivity. Conductive paste comprising conductive filler being composite particles including copper powder and nanosize precipitates which are disposed on the surface of the copper powder and composed of at least one kind of transition metal belonging to the group 8 to group 10 of the periodic table or a compound of the transition metal, and a binder resin.

22 Claims, 7 Drawing Sheets

(51) Int. Cl.

| | |
|---|---|
| *C08K 9/00* | (2006.01) |
| *B22F 1/02* | (2006.01) |
| *B22F 1/00* | (2006.01) |
| *B22F 9/08* | (2006.01) |
| *B22F 9/16* | (2006.01) |
| *C09C 1/62* | (2006.01) |
| *C09C 1/66* | (2006.01) |
| *C09D 5/26* | (2006.01) |
| *C09D 161/06* | (2006.01) |
| *C09K 5/14* | (2006.01) |
| *C22F 1/08* | (2006.01) |
| *C23C 8/20* | (2006.01) |
| *C23C 16/26* | (2006.01) |
| *C23C 16/44* | (2006.01) |
| *C23C 16/56* | (2006.01) |
| *C08K 9/02* | (2006.01) |

(52) U.S. Cl.
CPC .......... *B22F 1/0059* (2013.01); *B22F 1/0085* (2013.01); *B22F 1/025* (2013.01); *B22F 9/082* (2013.01); *B22F 9/16* (2013.01); *C09C 1/627* (2013.01); *C09C 1/66* (2013.01); *C09D 5/24* (2013.01); *C09D 5/26* (2013.01); *C09D 161/06* (2013.01); *C09K 5/14* (2013.01); *C22F 1/08* (2013.01); *C23C 8/20* (2013.01); *C23C 16/26* (2013.01); *C23C 16/4417* (2013.01); *C23C 16/56* (2013.01); *H01B 1/02* (2013.01); *B22F 2201/10* (2013.01); *B22F 2201/30* (2013.01); *B22F 2301/10* (2013.01); *B22F 2302/10* (2013.01); *B22F 2302/25* (2013.01); *B22F 2302/45* (2013.01); *B22F 2304/054* (2013.01); *B22F 2304/10* (2013.01); *B22F 2998/10* (2013.01); *C08K 9/02* (2013.01); *C08K 2201/001* (2013.01); *C08K 2201/003* (2013.01); *C08K 2201/005* (2013.01); *C08K 2201/011* (2013.01)

(58) Field of Classification Search
CPC .. B22F 2201/10; B22F 2201/30; C09C 1/627; C09C 1/66; C09D 5/24; C09D 5/26; C09D 161/06; C09K 5/14; C22F 1/08; C23C 8/20; C23C 16/26; C23C 16/56; C08K 9/02; C08K 2201/001; C08K 2201/003; C08K 2201/00; H01B 1/00; H01B 1/02; H01B 1/22
USPC .......................................................... 252/500
See application file for complete search history.

(56) References Cited

U.S. PATENT DOCUMENTS

| | | |
|---|---|---|
| 2006/0065543 A1 | 3/2006 | Arai et al. |
| 2011/0141657 A1 | 6/2011 | Jeon et al. |
| 2015/0053753 A1 | 2/2015 | Komatsu et al. |

FOREIGN PATENT DOCUMENTS

| | | | |
|---|---|---|---|
| JP | 2004-162164 A | | 6/2004 |
| JP | 2004162164 A | * | 6/2004 |
| JP | 2006-147170 A | | 6/2006 |
| JP | 2012-180564 A | | 9/2012 |
| JP | 2012180564 A | * | 9/2012 |
| KR | 10-2012-0111698 A | | 10/2012 |
| KR | 10-2014-0063982 A | | 5/2014 |
| WO | WO-2013/018645 A1 | | 2/2013 |
| WO | WO-2013/077666 A1 | | 5/2013 |
| WO | WO-2013/145258 A1 | | 10/2013 |

OTHER PUBLICATIONS

Hashimoto, Mitsuo et al., "Nano-Structured Two-Phase Heat Spreader for Cooling Ultra-High Heat Flux Sources", Proceedings of the 14th International Heat Transfer Conference, 2010, vol. 3 (11 pages).
Written Opinion of the International Searching Authority (PCT/ISA/237) for Application No. PCT/JP2015/056216 dated May 26, 2015. (English Translation mailed Sep. 15, 2016).
International Search Report for the Application No. PCT/JP2015/056216 dated May 26, 2015.
Written Opinion of the International Searching Authority (PCT/ISA/237) for Application No. PCT/JP2015/056216 dated May 26, 2015.
Notification of Reasons for Refusal for the Application No. 2015-512946 from Japan Patent Office dated Oct. 2, 2018.
European Office Action for the Application No. EP 15 758 124.0 dated Dec. 3, 2018.
European Office Action for the Application No. 15 758 124.0 dated Sep. 26, 2019.

* cited by examiner

CONDUCTIVE FILLER, METHOD FOR MANUFACTURING CONDUCTIVE FILLER, AND CONDUCTIVE PASTE

TECHNICAL FIELD

The present invention relates to conductive filler having an electrical conductivity (electro-conductivity), a thermal conductivity and the like, a method for manufacturing the conductive filler and conductive paste.

BACKGROUND ART

It has hitherto been known that conductive paste prepared by mixing inorganic filler such as silver powder and a binder resin has high electro-conductivity and thermal conductivity.

For example, in the following Patent Document 1, electro-conductive paste prepared with silver fine particles has been disclosed. In Patent Document 1, it is stated that the above-mentioned silver fine particles can be fired at low temperatures.

PRIOR ART DOCUMENT

Patent Document

Patent Document 1: WO2013/018645

SUMMARY OF THE INVENTION

Problem to be Solved by the Invention

However, there has been a problem that the silver fine particles in Patent Document 1 require high production cost while having high electro-conductivity and the migration resistance is insufficient.

On the other hand, in electro-conductive paste using copper powder as metallic filler, there have been cases where a copper oxide film is generated by the reaction with oxygen at the time of being heated and cured in the atmosphere while the above-mentioned problem is solved. As such, in electro-conductive paste using copper powder as metallic filler, there have been cases where the electrical resistance becomes high and sufficient electro-conductivity is not attained.

An object of the present invention is to provide conductive filler with which the electro-conductivity and thermal conductivity can be effectively improved, a method for manufacturing the conductive filler and conductive paste.

Means for Solving the Problem

The conductive filler according to the present invention is composite particles including copper powder and nanosize precipitates which are placed on the surface of the copper powder and composed of at least one kind of transition metal belonging to the group 8 to group 10 of the periodic table or a compound of the transition metal.

In a specific aspect of the conductive filler according to the present invention, the nanosize precipitates exist also in the inside of the copper powder.

In another specific aspect of the conductive filler according to the present invention, the average particle diameter of the copper powder lies within the range of 1.0 μm to 25 μm. In the case of spherical powder, it is preferred that the average particle diameter of the copper powder lie within the range of 1.0 μm to 10 μm. Moreover, in the case of flaky powder, it is preferred that the average particle diameter of the copper powder lie within the range of 3.0 μm to 25 μm. The flaky powder is prepared by subjecting spherical powder having an average particle diameter within the range of 1.0 μm to 10 μm to flattening processing.

In a different specific aspect of the conductive filler according to the present invention, a film of the nanosize precipitate is formed on the surface of the copper powder and the film thickness of the film of the nanosize precipitate is less than or equal to 100 nm.

In yet another specific aspect of the conductive filler according to the present invention, the nanosize precipitates are particles and the particle diameter of the particle of the nanosize precipitate is less than or equal to 100 nm.

With regard to the conductive filler according to the present invention, the content of the transition metal or the compound of the transition metal preferably lies within the range of 0.1 to 6.0% by weight in 100% by weight of the composite particles.

With regard to the conductive filler according to the present invention, the transition metal is preferably cobalt.

With regard to the conductive filler according to the present invention, the compound of the transition metal is preferably at least one among an oxide of the transition metal and a carbide of the transition metal. More preferably, the compound of the transition metal is at least one among cobalt oxide and cobalt carbide.

With regard to the conductive filler according to the present invention, the copper powder is preferably composed of pure copper.

The conductive paste according to the present invention includes the conductive filler according to the present invention and a binder resin.

In the conductive paste according to the present invention, as the binder resin, at least one kind of resin selected from the group consisting of an epoxy resin, a polyester resin, a urethane resin, a phenol resin and an imide resin is preferably used.

More preferably, it is desirable that the binder resin in an amount of 10 to 35 parts by weight relative to 100 parts by weight of the conductive filler be included.

The conductive paste of the present invention may be electrically conductive paste, that is, electro-conductive paste and may be thermally conductive paste.

The method for manufacturing conductive filler according to the present invention is a method for manufacturing conductive filler constituted according to the present invention mentioned above, and includes the steps of: preparing composite metal powder comprising copper and at least one kind of transition metal belonging to the group 8 to group 10 of the periodic table or a compound of the transition metal which constitutes the material of nanosize precipitates; bringing a carbon source into contact with the surface of the composite metal powder to allow carbon to attach to the surface of the composite metal powder; subjecting the composite metal powder to a heat treatment to allow nanosize precipitates to precipitate on the surface of the composite metal powder; and removing at least some of carbon attaching to the surface of the composite metal powder to obtain conductive filler being composite particles.

In the method for manufacturing conductive filler according to the present invention, the step of preparing composite metal powder is preferably performed by an atomizing method.

The method for manufacturing conductive filler according to the present invention preferably further includes the step of allowing the composite metal powder to be added and mixed with a sintering inhibitor before the step of subjecting the composite metal powder to a heat treatment.

In the method for manufacturing conductive filler according to the present invention, the step of bringing a carbon source into contact with the surface of the composite metal powder is preferably performed by bringing a carbon-containing gas into contact with the composite metal powder at 250 to 400° C.

In the method for manufacturing conductive filler according to the present invention, the heat treatment is preferably performed at 400° C. to 700° C. under an inert gas atmosphere.

In the method for manufacturing conductive filler according to the present invention, the step of removing at least some of carbon attaching to the surface of the composite metal powder to obtain conductive filler is preferably performed by mixing the composite metal powder and a binder resin until at least some of carbon attaching to the surface of the composite metal powder is removed away.

In the method for manufacturing conductive filler according to the present invention, the mixing of the composite metal powder and the binder resin is preferably performed by being kneaded for 20 minutes to 1 hour.

The method for manufacturing conductive filler according to the present invention preferably further includes the step of bringing a carbon source into contact with the surface of the composite metal powder by a CVD method to allow a carbon allotrope to grow out from the surface of the composite metal powder; and the high-temperature heat treatment step of subjecting the composite metal powder having the carbon allotrope grown out from the surface thereof, to a heat treatment at 650° C. to 950° C. under an inert gas atmosphere, after the step of subjecting the composite metal powder to a heat treatment, wherein the carbon allotrope is removed together with the carbon attaching to the surface of the composite metal powder.

Effect of the Invention

In the conductive filler and conductive paste according to the present invention, nanosize precipitates, which are composed of at least one kind of transition metal belonging to the group 8 to group 10 of the periodic table or a compound of the transition metal, are disposed on the surface of copper powder. Accordingly, it becomes possible to provide conductive filler and conductive paste which exhibit high electro-conductivity and high thermal conductivity.

MODE FOR CARRYING OUT THE INVENTION

Hereinafter, the details of the present invention will be described.

The conductive filler according to the present invention is composite particles including copper powder and nanosize precipitates which are disposed on the surface of the copper powder and composed of at least one kind of transition metal belonging to the group 8 to group 10 of the periodic table or a compound of the transition metal. Preferably, it is desirable that the nanosize precipitates exist also in the inside of the copper powder. More preferably, it is desirable that the nanosize precipitates exist more on the surface of the copper powder than in the inside of the copper powder.

In the present invention, the nanosize precipitate refers to a substance formed as a separate solid matter in the course of the manufacturing process, while it is solutionized into or is dissolved in copper powder or a solution containing copper powder at an early stage of the manufacturing process, and then, to form as a precipitate in the course of the manufacturing process, and it is preferred that the shape thereof be a particle-like shape or a film-like shape.

The nanosize precipitates exist in the inside of the copper powder and on the surface of the copper powder, and it is preferred that the particle diameter or the film thickness be less than or equal to 200 nm. The particle diameter or the film thickness of the nanosize precipitate is more preferably less than or equal to 100 nm and further preferably less than or equal to 25 nm. Moreover, when the density of the nanosize precipitate on the copper particle surface becomes high, the nanosize precipitate in the form of particles with a dot-like shape is changed into one in the form of dendrites or one in the form of a film with a sea-island structure.

These precipitates are observed with a transmission electron microscope (TEM).

In this connection, although it is difficult to observe all kinds of nanosize precipitates with a transmission electron microscope, in fact, a nanosize precipitate with a particle diameter or a film thickness less than or equal to 200 nm has been confirmed by means of a transmission electron microscope.

Examples of an element which becomes a P-type oxide semiconductor include chromium, manganese, iron, cobalt, nickel, palladium and copper in the group 7 to group 11 of the periodic table.

Although at least one kind of transition metal belonging to the group 8 to group 10 of the periodic table which constitutes the nanosize precipitates is not particularly limited, examples thereof include iron, cobalt, nickel, palladium or the like.

Of these, iron, nickel and cobalt are preferred because oxides thereof are semiconductors and have a high level of catalytic activity. Moreover, iron or cobalt is more preferred because the element easily precipitates on the surface of the copper powder by a heat treatment. Further preferred is cobalt. In this connection, the nanosize precipitates may contain plural kinds of transition metal.

Although the compound of at least one kind of transition metal belonging to the group 8 to group 10 of the periodic table is not particularly limited, examples thereof include cobalt oxide, cobalt carbide, nickel oxide, or the like. Preferably, it is desirable that the compound be at least one among an oxide of the transition metal and a carbide of the transition metal. More preferably, the compound is at least one among cobalt oxide and cobalt carbide. In this connection, the nanosize precipitates may contain plural kinds of transition metal and plural kinds of compounds of the transition metal, and the compound may be a layered transition metal oxide containing the above-mentioned metal and copper.

The proportion of the transition metal or the compound of the transition metal contained in the composite particles is preferably 0.1 to 6.0% by weight, more preferably 0.1 to 2.0% by weight and further preferably 0.3 to 1.0% by weight, in 100% by weight of the composite particles. When the proportion of the transition metal or the compound of the transition metal contained lies within the above-mentioned range, according to the present invention, it is possible to more surely provide conductive filler and conductive paste which are excellent in electrical conductivity and thermal conductivity.

Moreover, it is preferred that 10% or more of the surface of copper powder be covered with the nanosize precipitates. In this context, the surface of copper powder may be dotted with the nanosize precipitates as nanosize particles, and a film thereof may be formed. By allowing a small amount of transition metal to be contained in this way, it is possible to prevent the oxidation. In the case of the film, the film of the nanosize precipitates acts as a passive state film, and it is possible to more effectively prevent the oxidation of copper.

Although the nanosize precipitates are not particularly limited, it is desirable that the nanosize precipitates be precipitates with a particle diameter or a film thickness less than or equal to 100 nm. More preferably, the nanosize precipitates are precipitates with a particle diameter or a film thickness less than or equal to 25 nm.

For example, the copper powder is obtained by being pulverized by an atomizing method. The average particle diameter of this copper powder is not particularly limited, and is preferably 0.5 μm to 50 μm, more preferably 1.0 μm to 10 μm and further preferably 1.0 μm to 5 μm.

In this connection, in the present specification, the average particle diameter refers to the volume average particle diameter, and can be measured by means of a laser diffraction/scattering type particle size distribution measuring apparatus. The shape of the particle is assumed to be a spherical shape and the volume average particle diameter is calculated with software in the apparatus. As the apparatus, for example, an apparatus of the article number "MT3300 II" available from MicrotracBEL Corp. can be used.

In this connection, although the copper powder may have a spherical shape, it is desirable that the copper powder have a flaky shape with an aspect ratio larger than 1. Accordingly, it is preferred that, after the atomization, copper powder be subjected to a flattening treatment by a ball-mill treatment, a treatment in which a cold spray method, an aerosol deposition method or a flame coating method is applied to powder processing, or the like.

In the case of using flaky powder, spherical powder needs only to be processed into a flaky shape. It is preferred that flaky powder with an average major axis diameter of 3.0 μm to 25 μm obtained by forming spherical powder with an average particle diameter of 1.0 μm to 10 μm into a flaky shape by means of a ball mill, a bead mill, or the like be used.

Moreover, it is desirable that flattening-treated powder and flattening-untreated powder be blended with each other to be formed into paste.

When the average particle diameter of copper powder lies within the above-mentioned preferred range, according to the present invention, it is possible to more surely provide conductive paste which is excellent in electrical conductivity and thermal conductivity.

It is preferred that the copper powder be composed of pure copper. In this case, the conductive filler of the present invention can be obtained by various manufacturing methods.

Moreover, it is desirable that the copper powder be previously washed with an etchant or the like to be purified before allowing carbon described below to adhere to the surface thereof.

Cobalt oxide and cobalt carbide are semiconductors and conduct electricity. Since such semiconductive electro-conductivity is smaller than the electro-conductivity of a metal such as copper, it is desirable that precipitates on the surface of the copper powder be of nanosize.

Moreover, as a passivation film which has a corrosion resistance effect, it has been known that a passivated layer with a film thickness of 3 to 50 Å is formed depending on the materials. It is desirable that the film thickness of the nanosize precipitate in the form of a film is greater than or equal to the thickness of several tens of atomic layers. On the other hand, with regard to the nanosize precipitate in the form of particles, it is desirable that several thousands or more of atoms be gathered.

Cobalt oxide can have several valence numbers, cobalt oxide can have a valence of +2 or +3 which are the most stable valence number, and cobalt oxide can also have a valence of +4. On that account, the phenomenon in which hopping electrical conduction between $Co^{3+}$ and $Co^{4+}$, as well as hopping electrical conduction between $Co^{2+}$ and $Co^{3+}$, occurs has been investigated. There is a possibility that the characteristics of a transition metal compound having such characteristics are involved in electro-conductivity.

However, measured values obtained in various investigations are values obtained from measurements under the condition of the bulk or the micron size, and there is a possibility that, under the nanosize condition or in the in-layer direction of cobalt oxide, semiconductive electro-conductivity or quantum dot-based electro-conductivity is further improved.

In the present invention, carbon and a carbon allotrope may be allowed to adhere to the nanosize precipitates. In this case, the nanosize precipitates are preferred because it is possible to prevent particles of composite metal powder from being sintered with one another in the high-temperature heat treatment step. Of course, the carbon and the carbon allotrope may not be allowed to adhere thereto. In that case, it is possible to further improve the electrical conductivity of conductive filler.

(Manufacturing Method of Conductive Filler)

The manufacturing method as an example of the method for manufacturing conductive filler according to the present invention includes the step of preparing composite metal powder comprising copper and at least one kind of transition metal belonging to the group 8 to group 10 of the periodic table which constitutes the material of nanosize precipitates, the step of bringing a carbon source into contact with the surface of the composite metal powder to allow carbon to adhere to the surface of the composite metal powder, the step of subjecting the composite metal powder to a heat treatment to allow the nanosize precipitates to precipitate on the surface of the composite metal powder, and the step of removing at least some of carbon adhering to the surface of the composite metal powder to obtain conductive filler.

Hereinafter, the manufacturing method as an example of the method for manufacturing conductive filler according to the present invention will be described in detail with reference to FIG. 1 and FIG. 2.

(1) Composite Metal Powder Manufacturing Step

Although the method of preparing the composite metal powder is not particularly limited, as described above, it is desirable that the composite metal powder be obtained by an atomizing method. In this case, it is possible to easily prepare composite metal powder in which is copper and additive.

The proportion of the transition metal or the compound of the transition metal contained in the composite metal powder is preferably 0.1 to 6.0% by weight, more preferably 0.1 to 2.0% by weight and further preferably 0.3 to 1.0% by weight, in 100% by weight of the composite metal powder. When the proportion of the transition metal or the compound of the transition metal contained lies within the above-mentioned range, according to the present invention, it is possible to more surely provide conductive filler and conductive paste which are excellent in electrical conductivity and thermal conductivity.

(2) Sintering Inhibitor Addition Step

As a pretreatment of Step 1-A described below, it is desirable to add a sintering inhibitor, which is composed of fine particles with a further smaller particle diameter than that of the composite metal powder, to the composite metal powder. With this setup, it is possible to more effectively prevent particles of composite metal powder from aggregating with one another in the heat treatment step (Step 1-B) described below. Examples of such a fine particle include aerosil, carbon black, ketjen black, and the like. It is desirable that the amount of the fine particle added be 0.05 to 2.0% by weight relative to the amount of the composite metal powder. More preferably, the amount of the fine particle added is 0.1% by weight to 2.0% by weight. In the case where the subsequent step is the step of allowing a pulverulent body to be spread all over a setter to be treated and the film thickness of the pulverulent body spread all over the setter is as thin as the diameter of the particle, this step is sometimes omitted.

(3) Low-Temperature Carbon Attachment Step

Hereinafter, the details will be described with reference to FIG. 1. In the figure, with regard to the shaded areas, the treatment is performed under an ethylene gas atmosphere, and with regard to areas other than the shaded areas, the treatment is performed under a nitrogen gas atmosphere.

Figure 1:
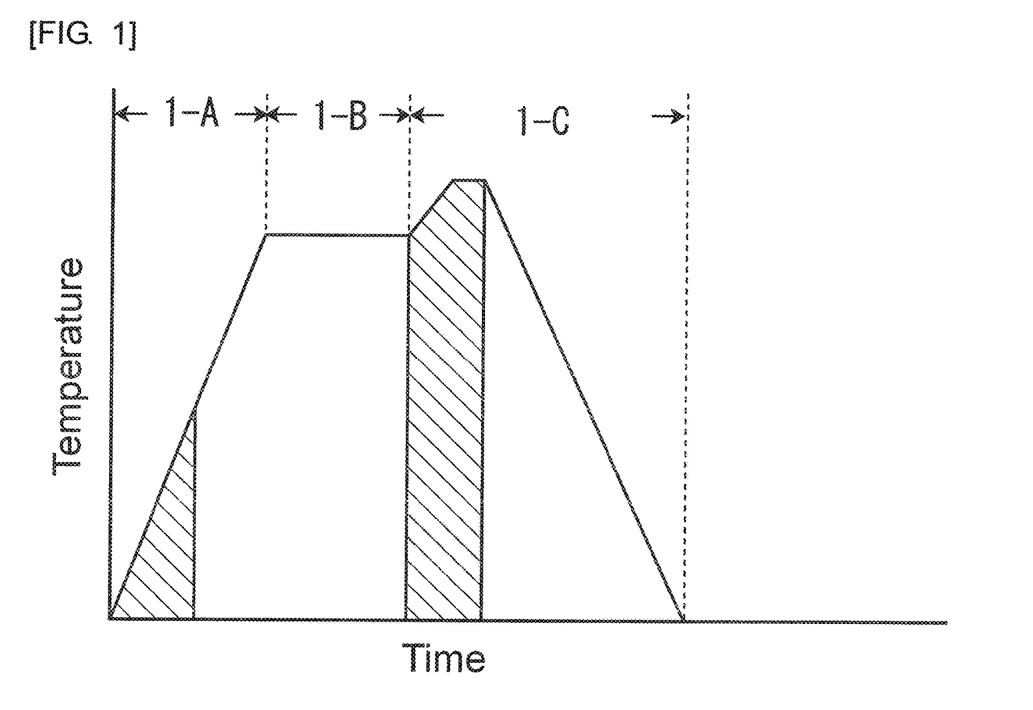
FIG. 1 is a graphical representation showing a heat profile as an example of the method for manufacturing conductive filler according to the present invention.

In Step 1-A shown in FIG. 1, a carbon source is brought into contact with the surface of the composite metal powder to allow carbon to adhere to the surface of the composite metal powder. In this step, it is considered that carbon adheres thereto but no carbon allotrope is generated. In this step, with regard to the color of the composite metal powder, no blackening due to adhesion of a carbon allotrope is observed and the composite metal powder has a copper color. With this setup, it is possible to suppress particles of composite metal powder from aggregating with one another in the heat treatment step (Step 1-B) described below.

As the carbon source, various carbon materials can be used. For example, a carbon-containing compound with 1 to 30, preferably 1 to 7, more preferably 1 to 4 and further preferably 1 or 2, carbon atoms can be used. Examples of such a compound include carbon monoxide, a hydrocarbon, a kind of alcohol or the like. As the hydrocarbon, a saturated hydrocarbon such as methane, ethane or propane, and an unsaturated hydrocarbon such as ethylene or acetylene can be appropriately used. Also, with regard to the alcohol, methanol, ethanol and the like can be appropriately used. These gases may be mixed with an inert gas, and may be fed with a low pressure.

It is preferred that the carbon source be a material which is gaseous at a temperature higher than or equal to 300° C. Also, it is desirable that the carbon source be brought into contact with the composite metal powder under a 250 to 400° C. temperature atmosphere.

(4) Heat Treatment Step

Next, in Step 1-B shown in FIG. 1, composite metal powder is subjected to a heat treatment. With this setup, it is possible to dispose nanosize precipitates on the surface of the composite metal powder.

Although the heat treatment condition is not particularly limited, it is desirable that the composite metal powder be held in place for 5 minutes to 100 minutes under a temperature of 400° C. to 700° C. Moreover, it is preferred that Step 1-B be performed under an inert gas atmosphere. Although the inert gas is not particularly limited, it is preferred that nitrogen gas or argon gas be used. There is a possibility that carbon, which is allowed to adhere thereto in the low-temperature carbon adhesion step, becomes a carbon allotrope during this heat treatment. Of course, in the present specification, the carbon allotrope obtained in the present step is also referred to as carbon in order to be distinguished from a carbon allotrope allowed to grow out by a thermal CVD method described below.

(5) Carbon Allotrope Growth Step by Thermal CVD Method

Next, in Step 1-C shown in FIG. 1, a carbon source is brought into contact with composite metal powder by a CVD method to allow a carbon allotrope to grow out from the nanosize precipitate which exists on the surface of the composite metal powder and acts as a catalyst. In this step, the composite metal powder turns brown, and furthermore, turns black when a carbon allotrope is allowed to adhere thereto. This carbon allotrope has a sintering-inhibitory effect on a pulverulent body in the subsequent high-temperature heat treatment step. In this connection, in the present invention, the present step may not be executed. As the carbon source, the same carbon materials as those in Step 1-A can be used. As shown in FIG. 1, Step 1-C can be performed at a higher temperature than that in the heat treatment step (Step 1-B). Of course, as shown in FIG. 2, Step 1-C may be performed at the same temperature as that in Step 1-B. This temperature varies with the catalytic activity of the nanosize precipitate, and the higher in activity the precipitate is, the more Step 1-C can be performed at a low temperature. Specifically, Step 1-C can be performed at a temperature of 400° C. to 700° C.

(6) High-Temperature Heat Treatment Step

Figure 2:
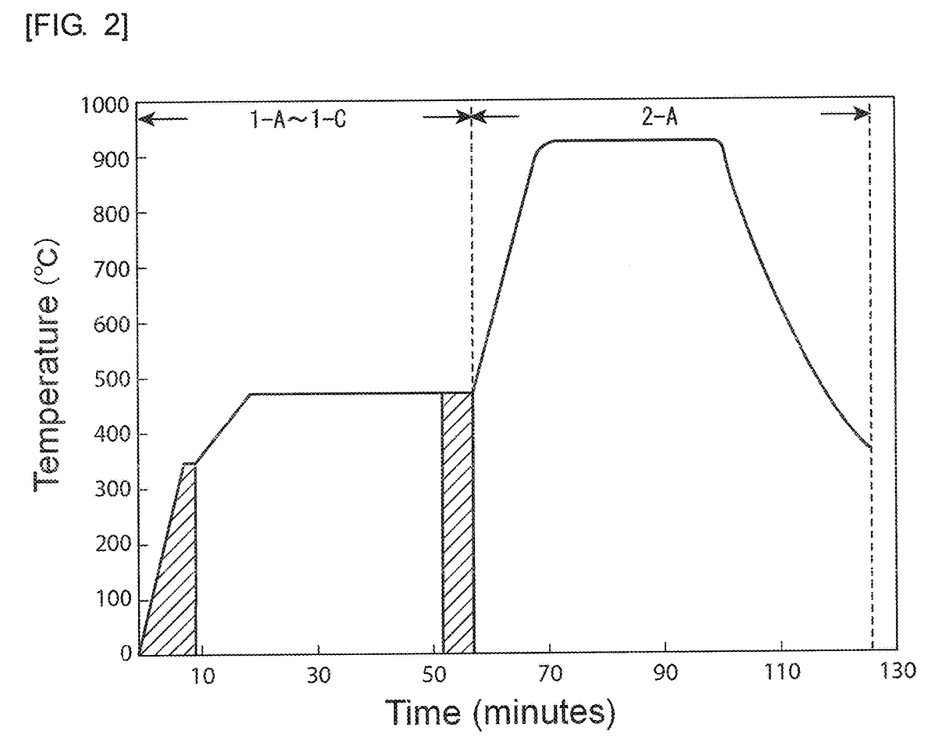
FIG. 2 is a graphical representation showing a heat profile as another example of the method for manufacturing conductive filler according to the present invention.

Furthermore, in the present invention, like another example of the heat profile shown in FIG. 2, the high-temperature heat treatment step (Step 2-A) in an inert gas atmosphere can be provided after Steps 1-A to 1-C. Also about FIG. 2, in the figure, with regard to the shaded areas, the treatment is performed under an ethylene gas atmosphere, and with regard to areas other than the shaded areas, the treatment is performed under a nitrogen gas atmosphere.

In the case where the Step 2-A is provided, the crystallinity of the carbon allotrope or the nanosize precipitate is improved, and it is possible to improve the electro-conductivity of the carbon allotrope. Furthermore, the case is preferred because, at the time of allowing the resulting conductive filler to be kneaded together with a binder resin to be formed into paste, the electro-conductivity can be further improved.

Although the inert gas is not particularly limited, it is preferred that nitrogen gas or argon gas be used.

It is preferred that the high-temperature heat treatment step (Step 2-A) be performed at a higher temperature than that in Steps 1-A to 1-C. More preferably, the temperature lies within the range of 650° C. to 950° C. In this connection, the Step 2-A may be performed separately from the CVD treatment steps 1-A to 1-C, or alternatively, like Step 1-C, may be omitted.

In the present invention, nanosize precipitates are disposed on the surface of the composite metal powder. Accordingly, it is possible to suppress the oxidation of copper. Preferably, it is desirable that the nanosize precipitates exist more on the surface of the composite metal powder than in the inside of the composite metal powder. The present step enables a larger amount of nanosize precipitates to exist on the surface of the composite metal powder.

(7) Carbon Allotrope Removal Step

Next, from composite metal powder which is at least subjected to the Step 1-A and Step 1-B treatments, at least some of carbon or a carbon allotrope adhering to the surface of the composite metal powder is removed away to obtain conductive filler. The present step may be executed before the filler is formed into paste (before paste blending) as described below, and may be executed after the filler is blended into paste (after blending). In this connection, the carbon or the carbon allotrope may be completely removed away from the surface of the composite metal powder. In that case, it is possible to further improve the electrical conductivity of the resulting conductive filler.

For example, the removal of the carbon or the carbon allotrope can be performed by mixing the composite metal powder and a binder resin until at least some of carbon or a carbon allotrope adhering to the surface of the composite metal powder is removed away.

With regard to the mixing method for the composite metal powder and the binder resin, composite metal powder, a resin and other additives are mixed, after which the mixture can be kneaded using a dissolver or a three roll mill. In the case of using a three roll mill, it is desirable that the gap between rolls be made wider than the primary particle diameter of the filler to knead the mixture.

With regard to the kneading condition, it is preferred that the kneading be performed by allowing the mixture to pass through a three roll mill a plurality of times to knead the mixture. Particles are milled by a dry type apparatus such as a jet mill, after which carbon can be removed away by air classification to reduce the amount thereof.

Preferably, after the mixing of composite metal powder to which the nanosize precipitates adhere and a binder resin, the kneading is performed for 3 minutes to 1 hour to knead the mixture. More preferably, the kneading is performed for 20 minutes to 1 hour to knead the mixture.

Preferably, after the mixing of composite metal powder to which the nanosize precipitates adhere and a binder resin, the kneading is performed by allowing the mixture to pass through a three roll mill a prescribed number of times to knead the mixture.

In this connection, the binder resin and the conductive filler which are in a state of being mixed with each other may also be used directly as conductive paste.

In the manufacturing method as an example of the method for manufacturing conductive filler, the carbon allotrope which is allowed to grow out in (5) Carbon allotrope generation step by thermal CVD method is removed away in (7) Carbon allotrope removal step to obtain conductive filler.

In the present invention, conductive filler may be obtained without executing (5) Carbon allotrope generation step by thermal CVD method in the manufacturing method as an example of the method for manufacturing conductive filler, that is, without allowing a carbon allotrope to grow out.

In that case, it is desirable that no carbon allotrope be allowed to grow out also in (3) Low-temperature carbon adhesion step and (4) Heat treatment step. Specifically, it is desirable that the temperature in (3) Low-temperature carbon adhesion step be set to a temperature lower than or equal to the activation temperature of a carbon allotrope generating catalyst. For example, in the case where the carbon source is ethylene, it is preferred that the temperature be set to 250° C. to 400° C. Moreover, in the case of (4) Heat treatment step, the treatment needs only to be performed in an inert gas.

Moreover, by allowing all the temperatures in (3) Low-temperature carbon adhesion step, (4) Heat treatment step and (5) Carbon allotrope generation step by thermal CVD method to be set to respective temperatures lower than or equal to the activation temperature of a carbon allotrope generating catalyst, a carbon allotrope may not be allowed to grow out.

In the case of allowing no carbon allotrope to grow out, it is desirable that a larger amount of a sintering inhibitor in (2) Sintering inhibitor addition step be added within the range of not lowering the electro-conductivity due to the sintering inhibitor. On that account, even when no carbon allotrope is allowed to grow out, it is possible to prevent particles of composite metal powder from aggregating with one another. Accordingly, in this case, it is preferred that the amount of the sintering inhibitor added be set to 0.5% by weight to 2.0% by weight.

(Conductive Paste)

The conductive paste according to the present invention includes conductive filler and a binder resin. The binder resin is not particularly limited and appropriate binder resins which have hitherto been used for electro-conductive paste and thermally conductive paste can be used. As such a resin, at least one kind selected from the group consisting of an epoxy resin, a polyester resin, a urethane resin, a phenol resin and an imide resin can be suitably used. In the case of using these resins and a solvent, it is possible to obtain thermosetting type paste or heat drying type paste. Of course, the binder resin needs only to be appropriately selected according to the purpose of use of electro-conductive paste, thermally conductive paste or the like.

As a binder resin used for electro-conductive paste, a polyester resin, an acrylic resin, a butyral resin and the like can be used. A thermoplastic resin such as a thermoplastic polyimide can also be used. Of course, it is desirable that a thermosetting resin be used in order to secure the heat resistance.

That is, as the thermosetting resin, various epoxy resins, polyester resins, urethane resins, phenol resins, thermosetting polyimides and the like can be used, and a hardener may be contained therein.

In this connection, in the case of using a thermoplastic resin, a hardener which hardens the thermoplastic resin may be contained in conductive paste. Examples of such a hardener include an amine-based epoxy hardener, an acid anhydride-based epoxy hardener, an isocyanate-based hardener, an imidazole-based hardener and the like. These resins may contain a solvent.

Although the blending proportion of the binder resin is not particularly limited, it is preferred that 10 to 35 parts by mass of the binder resin be contained relative to 100 parts by mass of the conductive filler.

In this connection, in the case of using a thermosetting resin and/or a thermoplastic resin, with regard to the addition amount of these resins, it is desirable that 10 to 35 parts by mass thereof be contained relative to 100 parts by mass of the conductive filler in terms of the weight ratio after the paste is dried or hardened. It is more preferred that 10 to 20 parts by mass of the thermosetting resin and the thermoplastic resin be contained.

One kind of the binder resin may be used alone and two or more kinds thereof may be combinedly used.

Moreover, in the present invention, an inorganic filling material such as silica and calcium carbonate other than the carbon material may be added to the conductive paste in order to adjust the thixotropy. Furthermore, various coupling agents may be added in order to improve the adhesion. The manufacturing method of the conductive paste is not particularly limited, and the conductive filler, a binder resin, an optional additive mentioned above and optional other additives such as a solvent and a reducing agent need only to be mixed by an appropriate method.

The conductive paste according to the present invention can be manufactured by using a binder resin for the removal of carbon or a carbon allotrope in the manufacturing method of the conductive filler. In that case, the carbon or the carbon allotrope peeled off may remain in the binder resin. In the present manufacturing method, the removal of carbon or a carbon allotrope and the mixing with a binder resin can be performed in the same step, and the method is preferred because the manufacturing process can be simplified.

In this connection, conductive paste can also be obtained by isolating the conductive filler once from the binder resin, and separately, mixing the conductive filler with a binder resin. In that case, the paste may have low viscosity in view of the binder resin separation firstly performed. Depending on the kneading apparatus, the binder may be composed only of a solvent.

Since carbon or a carbon allotrope does not remain in the binder resin, it is possible to obtain conductive paste with an effectively heightened solid content in the paste.

Also about this mixing method, conductive filler, a resin and other additives are mixed, after which the mixture can be kneaded using a dissolver or a three roll mill. In the case of using a three roll mill, it is desirable that the gap between rolls be set wider than the primary particle diameter of the filler to knead the mixture. On that account, it is possible to obtain more homogeneous conductive paste.

The conductive paste according to the present invention can be suitably used as various kinds of electrically conductive paste, namely, electro-conductive paste, which are used for the electro-conductive adhesive and the formation of an electro-conductive pattern and the like. From a different point of view, since the conductive filler has a structure allowing nanosize precipitates to be disposed on the surface of copper, the conductive filler is excellent in thermal conductivity. Accordingly, the conductive paste can be suitably used also as thermally conductive paste.

Next, effects of the present invention will be elucidated with reference to specific examples of the present invention.

(1) Manufacture of Composite Metal Powder

By a high pressure water atomizing method, particles of composite metal powder composed of copper and an additive to copper shown in Table 1 were produced, and the particles were subjected to classification by means of a pneumatic classifier to obtain particles of composite metal powder with an average particle diameter of 3 µm. Particle diameters of the obtained particles of composite metal powder ranged from 2.95 µm to 3.15 µm.

Specifically, respective kinds of composite metal powder having a composition shown in the column of Composition of composite metal powder of the following Table 1 were prepared. In the column of Composition of composite metal powder of Table 1, the kind of the additive to copper and the proportion of the additive to copper contained in 100% by weight of composite metal powder are shown.

TABLE 1

| | Conductive filler | Composition of composite metal powder | Amount of aerosil added | Step 1-A Temperature increasing | | | Step 1-B Temperature is increased, and then. held at a constant temperature | | |
|---|---|---|---|---|---|---|---|---|---|
| | | | | Temperature (° C.) | Time for temperature increasing (minutes) | Gas (50 cc) | Temperature (° C.) | Holding time (minutes) | Gas (50 cc) |
| Ex. 1 | Composite particle A | Co 1.0% by weight | 0.25% by weight | RT→350 | 10 | Ethylene | 350→475 | 30 | Nitrogen |
| | Composite particle B | Co 3.7% by weight | 0.25% by weight | RT→350 | 10 | Ethylene | 350→475 | 30 | Nitrogen |
| Ex. 3 | Composite particle C | Co 1.0% by weight | 0.25% by weight | RT→350 | 10 | Ethylene | 350→475 | 30 | Nitrogen |
| | Composite particle C | Co 1.0% by weight | 0.25% by weight | RT→350 | 10 | Ethylene | 350→475 | 30 | Nitrogen |
| | Composite particle D | Co 1.0% by weight | 0.25% by weight | RT→350 | 10 | Ethylene | 350→475 | 30 | Nitrogen |
| | Composite particle E | Co 0.9% by weight Fe 0.9% by weight | 0.25% by weight | RT→350 | 10 | Ethylene | 350→475 | 30 | Nitrogen |

TABLE 1-continued

| | | | Step 1-A Temperature is increased | | | Step 1-B Temperature is held at a constant temperature | | |
|---|---|---|---|---|---|---|---|---|
| | | Amount of aerosil added | Temperature (° C.) | Holding time (minutes) | Gas (50 cc) | Temperature (° C.) | Holding time (minutes) | Gas (50 cc) |
| Composite particle F | Co 0.3% by weight / Fe 0.3% by weight | — | — | — | — | — | — | — |
| Composite particle G | Co 1.0% by weight | 1.00% by weight | RT→250 | 15 | Ethylene | 250 | 2 | Nitrogen |

| | Step 1-C Temperature is increased, and then, held at a constant temperature | | | Step 2-A Temperature is increased, and then, held at a constant temperature | | | Cooling Temperature decreasing Gas (50 cc) | FIG(S). |
|---|---|---|---|---|---|---|---|---|
| | Temperature (° C.) | Holding time (minutes) | Gas (50 cc) | Temperature (° C.) | Holding time (minutes) | Gas (50 cc) | | |
| Ex. 1 | 475 | 2 | Ethylene | 925 | 30 | Nitrogen | Nitrogen | FIG(S).3 |
| | 475 | 2 | Ethylene | 925 | 30 | Nitrogen | Nitrogen | |
| Ex. 3 | — | — | — | — | — | — | Nitrogen | FIG(S).4, 5 |
| | — | — | — | — | — | — | Nitrogen | |
| | 550 | 2 | Ethylene | 925 | 30 | Nitrogen | Nitrogen | |
| | 550 | 2 | Ethylene | 925 | 30 | Nitrogen | Nitrogen | |
| | — | — | — | — | — | — | — | |
| | 250 | 10 | Nitrogen | 700 | 60 | Nitrogen | Nitrogen | |

As shown in the foregoing Table 1, the composition of the composite metal powder constituting Composite particles A, C, D and G is 99.0% by weight of copper and 1.0% by weight of cobalt. The composition of the composite metal powder constituting Composite particle B is 96.3% by weight of copper and 3.7% by weight of cobalt. The composition of the composite metal powder constituting Composite particle E is 98.2% by weight of copper, 0.9% by weight of cobalt and 0.9% by weight of iron. The composition of the composite metal powder constituting Composite particle F is 99.4% by weight of copper, 0.3% by weight of cobalt and 0.3% by weight of iron.

(2) Treatments Performed in Low-Temperature Carbon Adhesion Step to High-Temperature Heat Treatment Step for Composite Metal Powder Each of the respective kinds of composite metal powder obtained as above was used, and aerosil was added thereto and dispersed therein, after which Composite particles A to G, which are conductive filler, were prepared in the following way. That is, in a cylindrical quartz cell with an inner diameter of 26 mm and a length of 120 mm, 6 g of composite metal powder was placed, and in a rotary kiln provided with a cylindrical quartz tube with an inner diameter of 32 mm and a length of 700 mm, ethylene as a carbon source was brought into contact with the composite metal powder to obtain each of Composite particles A to G in which nanosize precipitates are disposed on the surface of the composite metal powder.

In this connection, conditions for obtaining Composite particles A to G are shown in the foregoing Table 1. In Table 1, as the aerosil, one with the trade name: AEROSIL 300 available from NIPPON AEROSIL CO., LTD. was used. In this connection, the addition amount of aerosil described in Table 1 refers to the addition amount relative to 100% by weight of composite metal powder. With regard to Composite particle G in which Step 1-A to Step 1-C were performed at low temperatures, the amount of aerosil added was set to 1.00% by weight. Moreover, one which has a composition shown in Table 1 and is not subjected to treatments to be performed in low-temperature carbon adhesion step to high-temperature heat treatment step is defined as Composite particle F.

(3) Preparation of Paste

Each of Composite particles A to G obtained as above, a phenol resin as a binder resin and BCA (butyl cellosolve acetate) or ethoxyethoxyethanol as a solvent were mixed in a proportion shown in the following Table 2. In this connection, for the mixing, a glass-made muller (glass muller) for the paint was used, and the contents were kneaded and dispersed over a kneading period of time shown in Table 2. By this operation, respective kinds of electro-conductive paste of Examples 2, 4 to 11 and Comparative Example 1 shown in Table 2 were obtained. In this connection, in Comparative Example 1, Composite particle F which is not subjected to treatments to be performed in low-temperature carbon adhesion step to high-temperature heat treatment step, a phenol resin and BCA were mixed.

TABLE 2

| | Ex. 2 | Ex. 4 | Ex. 5 | Ex. 6 | Ex. 7 | Ex. 8 | Ex. 9 | Ex. 10 | Ex. 11 | Comp. Ex. 1 |
|---|---|---|---|---|---|---|---|---|---|---|
| Composite particle B (parts by mass) | 100 | | | | | | | | | |
| Composite particle C (parts by mass) | | 100 | | | | | | | | |
| Composite particle D (parts by mass) | | | 100 | 100 | 100 | | | | | |
| Composite particle E (parts by mass) | | | | | | 100 | 100 | 100 | | |
| Composite particle F (parts by mass) | | | | | | | | | | 100 |
| Composite particle G (parts by mass) | | | | | | | | | 100 | |

TABLE 2-continued

| | Ex. 2 | Ex. 4 | Ex. 5 | Ex. 6 | Ex. 7 | Ex. 8 | Ex. 9 | Ex. 10 | Ex. 11 | Comp. Ex. 1 |
|---|---|---|---|---|---|---|---|---|---|---|
| Phenol resin (parts by mass) | 16 | 16 | 16 | 16 | 16 | 16 | 16 | 16 | 17 | 16 |
| BCA (parts by mass) | 15 | 15 | 15 | 15 | 15 | 15 | 15 | 15 | 15 | |
| Ethoxyethoxyethanol (parts by mass) | 3.5 | | | | | | | | | |
| Kneading time (minutes) | 15 | 15 | 0.5 | 3 | 15 | 0.5 | 3 | 15 | 15 | 15 |
| Specific resistance ($\Omega \cdot cm$) | — | $4.0 \times 10^{-2}$ | $1.2 \times 10$ | $1.6 \times 10^{-2}$ | $4.3 \times 10^{-3}$ | $5.0 \times 10$ | $1.2$ | $1.8 \times 10^{-1}$ | $6.0 \times 10^{-4}$ | Not electrically conducted |
| | FIGS. 6 to 11 | | | | | | | | | |

As the phenol resin of Table 2, a known resol type phenol resin, which is used as a resin binder for ordinary electro-conductive paste, with the trade name: RESITOP PL-5208 available from Gun Ei Chemical Industry Co., Ltd. was used. In this connection, the solid content of PL-5208 was determined to be 63%.

(4) Evaluation (Evaluation Method)

Fine Structure Analysis:

In Example 1 and Example 3, the Composite particles A and C obtained respectively were observed by FE-SEM (scanning electron microscope) photographs. As the field emission type scanning electron microscope, the S-4800/hitachi was used.

A cured product prepared by curing the paste obtained in Example 2 was subjected to FIB processing to prepare a sample, and by means of FE-TEM/EDS, an STEM-HAADF image, a BF image and an EDS mapping image were obtained. As the transmission electron microscope, the JEM-ARM 200F/JOEL was used.

Figure 3:
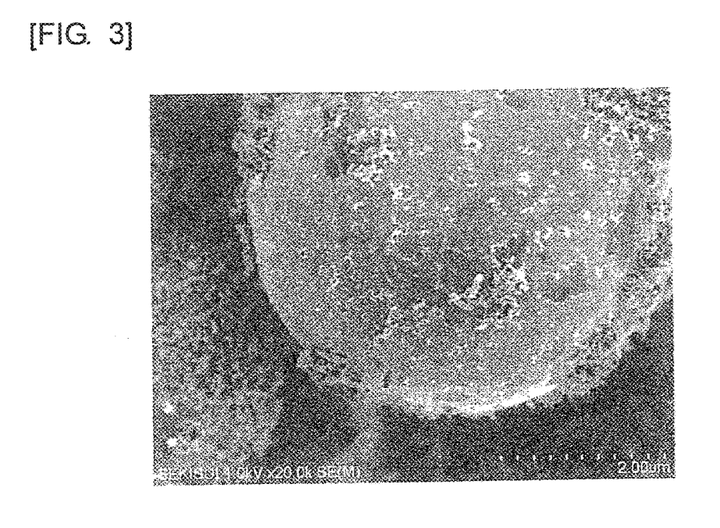
FIG. 3 is a representation showing an FE-SEM photograph at 20000 magnifications of composite particles obtained in Example 1.

FIG. 3 is an FE-SEM photograph at 20000 magnifications of a part of Composite particle A obtained in Example 1 where no carbon allotrope is generated. Moreover, FIG. 4 and FIG. 5 are FE-SEM photographs at 80000 magnifications and 100000 magnifications, respectively, of a part of Composite particle C obtained in Example 3 where no carbon allotrope is generated.

From FIG. 3, there is a white/black contrast difference on the surface of the composite particle and the white part has a plane-like shape. Since there is a white part of contrast, it has been found that light elements such as oxygen and carbon planarly exist on the surface.

Figure 4:
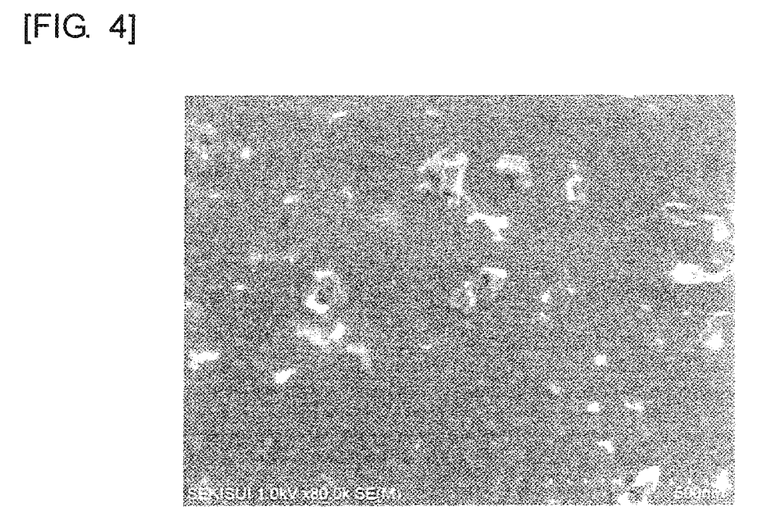
FIG. 4 is a representation showing an FE-SEM photograph at 80000 magnifications of composite particles obtained in Example 3.

From FIG. 4, there is a white/black contrast difference on the surface of the composite particle and the white part has a dot-like shape. Since there are white parts of contrast, it has been found that the surface is dotted with light elements such as oxygen and carbon.

Figure 5:
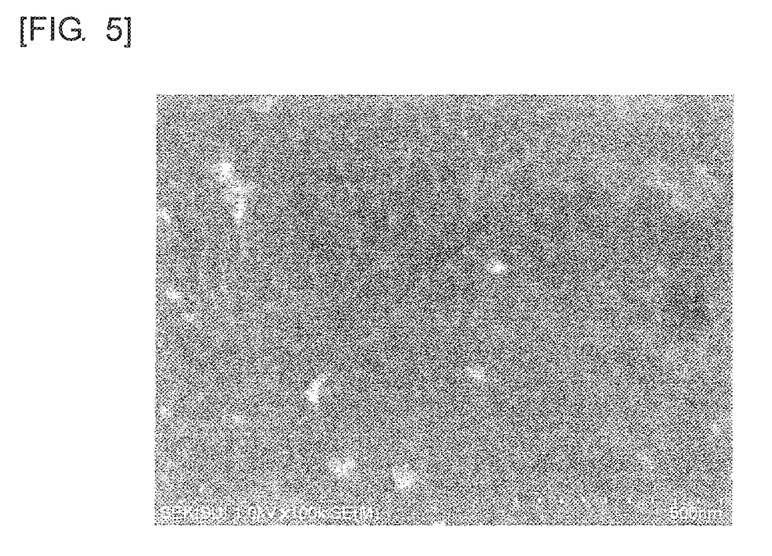
FIG. 5 is a representation showing an FE-SEM photograph at 100000 magnifications of composite particles obtained in Example 3.

From FIG. 5, there is a white/black contrast difference on the surface of the composite particle and ones in the form of dendrites are formed. Since there are white parts of contrast, it has been found that light elements such as oxygen and carbon in the form of dendrites exist on the surface.

Figure 6:
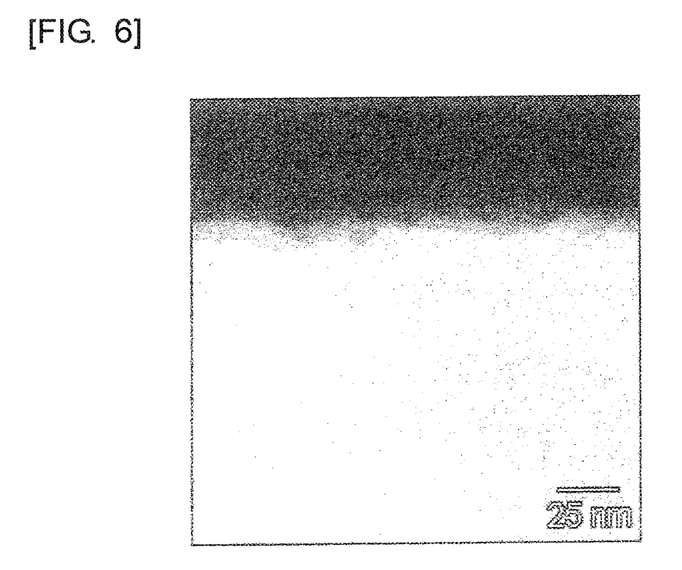
FIG. 6 is a representation showing a transmission electron microphotograph of composite particles in the paste obtained in Example 2. The length of the scale bar for a reduced scale in the figure corresponds to 25 nm.
Figure 7:
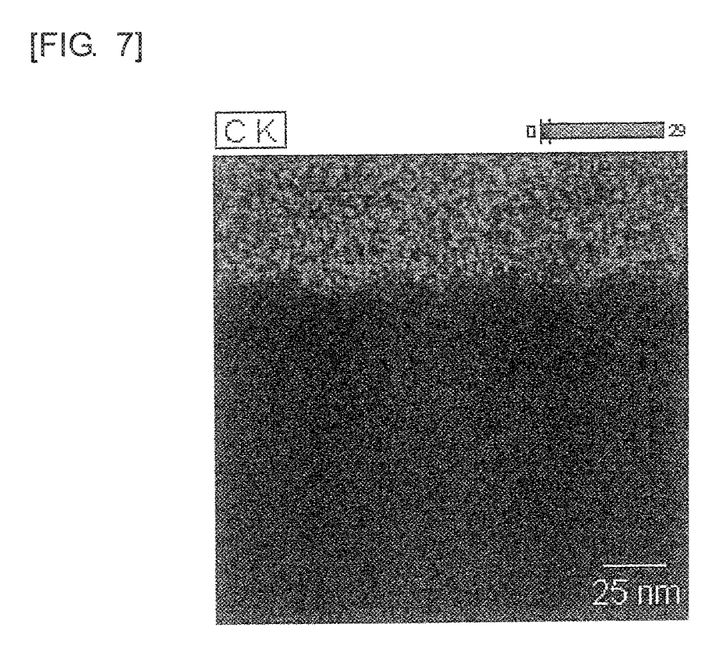
FIG. 7 is a representation showing an EDS element mapping image of C at the identical position in FIG. 6 observed with a transmission electron microscope.
Figure 8:
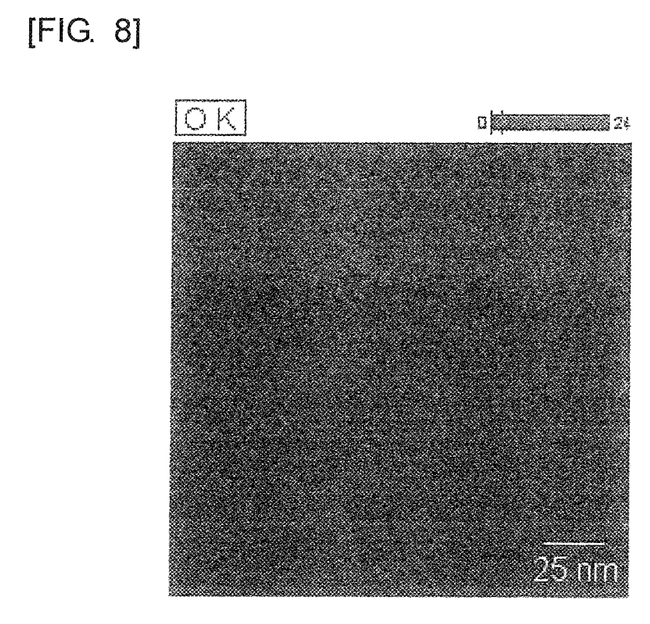
FIG. 8 is a representation showing an EDS element mapping image of O at the identical position in FIG. 6 observed with a transmission electron microscope.
Figure 9:
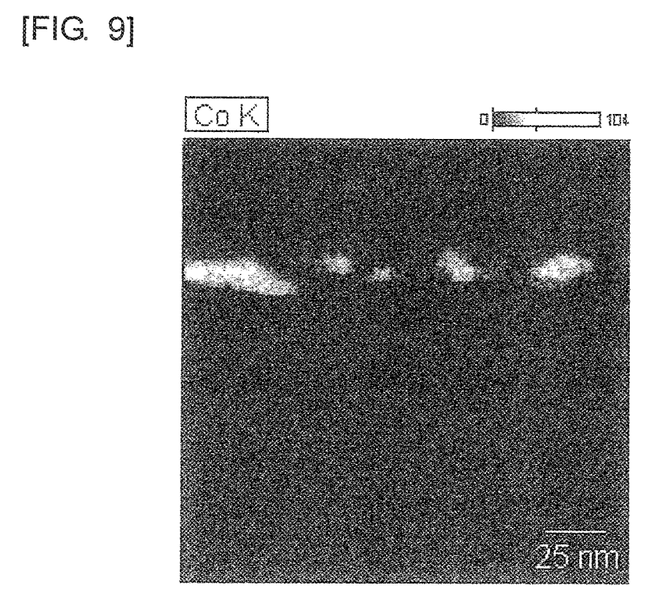
FIG. 9 is a representation showing an EDS element mapping image of Co at the identical position in FIG. 6 observed with a transmission electron microscope.
Figure 10:
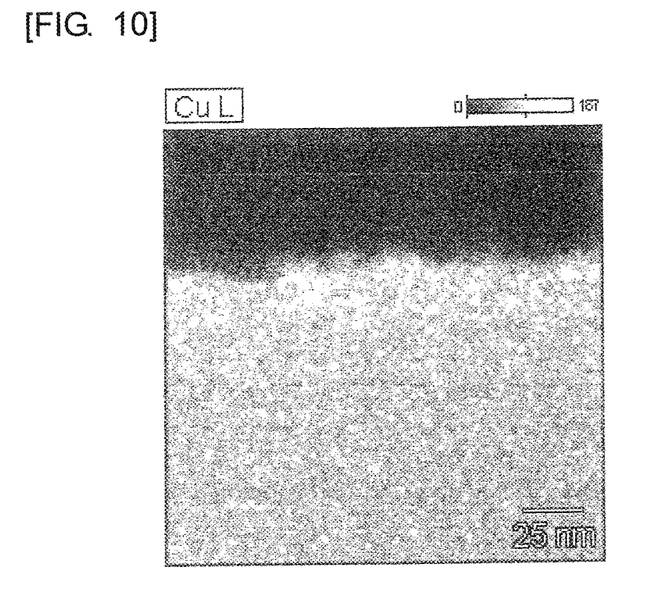
FIG. 10 is a representation showing an EDS element mapping image of Cu at the identical position in FIG. 6 observed with a transmission electron microscope.

FIG. 6 is a TEM photograph of composite particles in the paste obtained in Example 2 and the length of the scale bar for a reduced scale in the figure corresponds to 25 nm.

Moreover, FIG. 7 to FIG. 10, in number order, are EDS element mapping images of C, O, Co and Cu at the position of the TEM photograph shown in FIG. 6. From FIG. 6 to FIG. 10, it has been found that a nanosize layer with a film thickness of 10 to 20 nm composed of cobalt, oxygen and a small amount of carbon and nanosize particles with a particle diameter of 10 to 20 nm exist on the surface of the composite particle.

Figure 11:
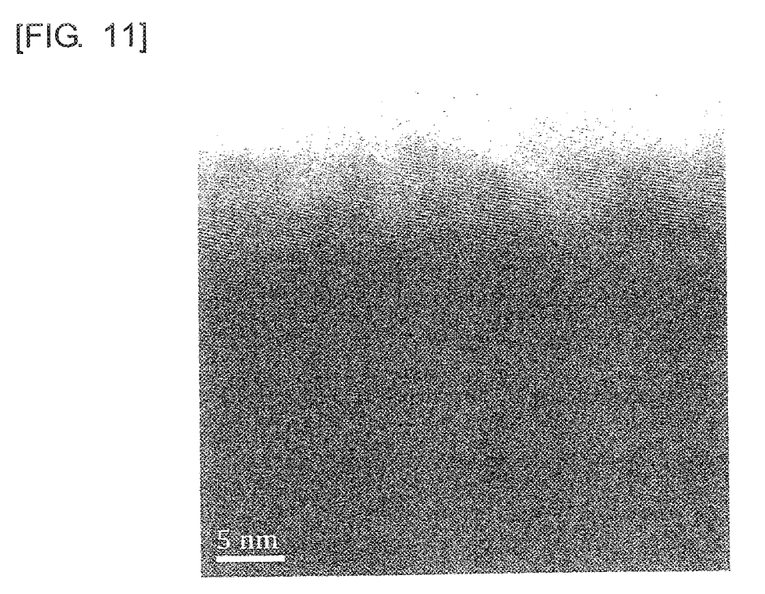
FIG. 11 is a representation showing an STEM-BF image of composite particles (the conductive filler) obtained in Example 2. The length of the scale bar for a reduced scale in the figure corresponds to 5 nm.

FIG. 11 is an STEM-BF image of Composite particle B obtained in Example 2 and the length of the scale bar for a reduced scale in the figure corresponds to 5 nm.

As shown in FIG. 11, it has been found that the portion near the surface of the composite particle has a crystallinity. Moreover, it has been found that a composition layer differing from the inside is formed.

Evaluation for Electro-Conductivity:

A layer of electro-conductive paste with a width of 2 mm, a length of 100 mm and a thickness of 40 to 100 μm was applied onto an epoxy substrate and thermally cured for 30 minutes, after which the specific resistance was measured by a four-terminal method with a low-resistance digital multimeter. The specific resistance is determined by the equation of Specific resistance=R×S/L (Ω·cm). R represents the resistance value of the digital multimeter, S represents the cross section of the coated film composed of electro-conductive paste, and L represents the distance between electrodes. In this connection, the thermal curing was performed at a temperature of 170° C. in the atmosphere containing oxygen.

Figure 12:
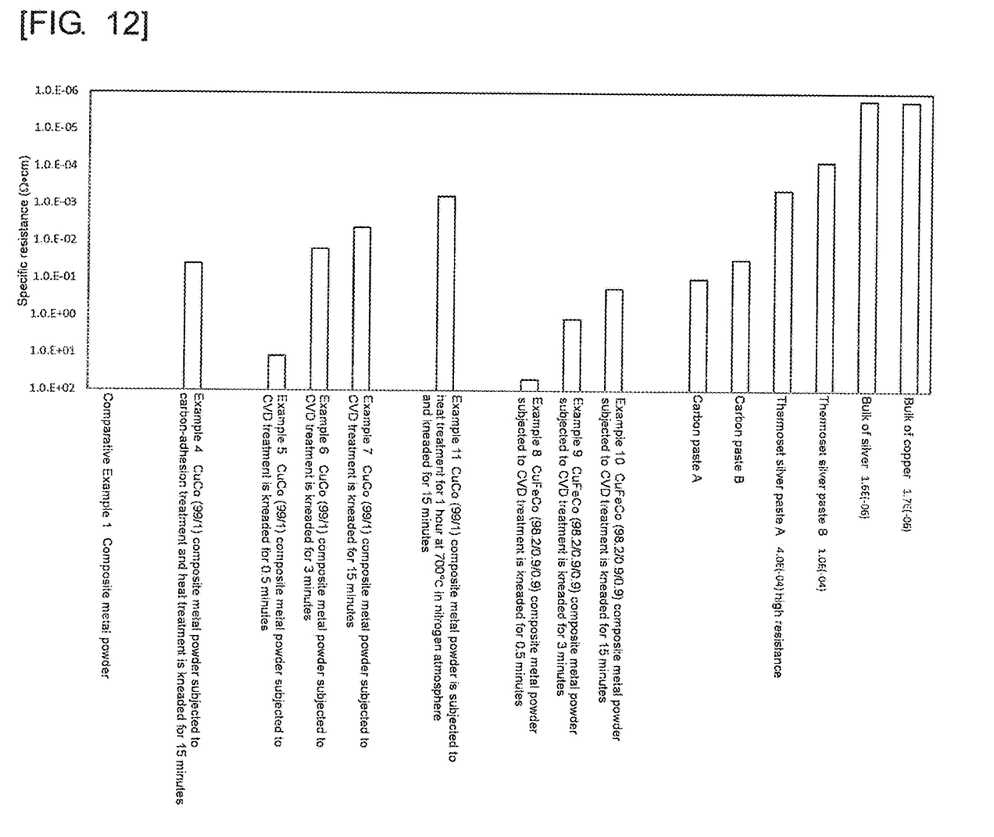
FIG. 12 is a graphical representation showing the specific resistance measurement results of Examples 4 to 11 and Comparative Example 1.

In FIG. 12 and Table 2, the specific resistance measurement results of Examples 4 to 11 and Comparative Example 1 are shown. In the respective kinds of electro-conductive paste of Examples 4 to 11, it has been found that the specific resistance thereof becomes small as compared with the electro-conductive paste of Comparative Example 1. Moreover, it has been found that the resistance value is further lowered, as compared with the case the kneading period of time is short. Moreover, in the electro-conducting paste of Example 11, it has been found that the specific resistance thereof becomes further smaller as compared with the respective kinds of electro-conducting paste of Examples 4 to 10. In this connection, in FIG. 12, the carbon paste, the thermoset silver paste, the bulk of silver and the bulk of copper are examples for resistance values.

The invention claimed is:

1. A conductive filler comprising:
   composite particles comprising copper powder and nanosize precipitates which are placed on the surface of the copper powder,
   wherein the nanosize precipitates are composed of at least one kind of transition metal selected from the group consisting of iron, ruthenium, osmium, hassium, cobalt, rhodium, iridium, meitnerium, nickel, palladium, platinum, and darmstadtium, or a compound of at least one kind of transition metal selected from the group consisting of iron, ruthenium, osmium, hassium, cobalt, rhodium, iridium, meitnerium, nickel, palladium, platinum, and darmstadtium,
   the average particle diameter of the copper powder lies within the range of 1.0 μm to 25 μm, and the nanosize precipitates are particles and the particle diameter of the particle of the nanosize precipitate is less than or equal to 100 nm, and wherein the transition metal is cobalt.

2. The conductive filler according to claim 1, wherein the nanosize precipitates exist also in the inside of the copper powder.

3. The conductive filler according to claim 1, wherein the content of the transition metal or the compound of the transition metal lies within the range of 0.1 to 6.0% by weight in 100% by weight of the composite particles.

4. The conductive filler according to claim 1, wherein the compound of the transition metal is at least one among an oxide of the transition metal and a carbide of the transition metal.

5. The conductive filler according to claim 4, wherein the compound of the transition metal is at least one among cobalt oxide and cobalt carbide.

6. The conductive filler according to claim 1, wherein the copper powder is composed of pure copper.

7. A conductive paste comprising the conductive filler according to claim 1 and a binder resin.

8. The conductive paste according to claim 7, wherein the binder resin is at least one kind of resin selected from the group consisting of an epoxy resin, a polyester resin, a urethane resin, a phenol resin and an imide resin.

9. The conductive paste according to claim 7, wherein the binder resin in an amount of 10 to 35 parts by weight relative to 100 parts by weight of the conductive filler is included.

10. The conductive paste according to claim 7 being an electrically conductive paste.

11. The conductive paste according to claim 7, being thermally conductive paste.

12. The conductive paste according to claim 7, further comprising a hardener selected from the group consisting of an amine-based epoxy hardener, an acid anhydride-based epoxy hardener, an isocyanate-based hardener, and an imidazole-based hardener.

13. The conductive paste according to claim 7, further comprising an inorganic filling material selected from the group consisting of silica and calcium carbonate.

14. A method for manufacturing conductive filler according to claim 1, comprising the steps of:

preparing composite metal powder comprising copper and at least one kind of transition metal belonging to the group 8 to group 10 of the periodic table or a compound of the transition metal which constitutes the material of nanosize precipitates;

bringing a carbon source into contact with the surface of the composite metal powder to allow carbon to attach to the surface of the composite metal powder;

subjecting the composite metal powder to a heat treatment to allow nanosize precipitates to precipitate on the surface of the composite metal powder; and removing at least some of carbon attaching to the surface of the composite metal powder to obtain conductive filler being composite particles.

15. The method for manufacturing conductive filler according to claim 14, wherein the step of preparing composite metal powder is performed by an atomizing method.

16. The method for manufacturing conductive filler according to claim 14, further comprising the step of allowing the composite metal powder to be added and mixed with a sintering inhibitor before the step of subjecting the composite metal powder to a heat treatment.

17. The method for manufacturing conductive filler according to claim 14, wherein the step of bringing a carbon source into contact with the surface of the composite metal powder is performed by bringing a carbon-containing gas into contact with the composite metal powder at 250 to 400° C.

18. The method for manufacturing conductive filler according to claim 14, wherein the heat treatment is performed at 400° C. to 700° C. under an inert gas atmosphere.

19. The method for manufacturing conductive filler according to claim 14, wherein the step of removing at least some of carbon attaching to the surface of the composite metal powder to obtain conductive filler is performed by mixing the composite metal powder and a binder resin until at least some of carbon attaching to the surface of the composite metal powder is removed away.

20. The method for manufacturing conductive filler according to claim 19, wherein the mixing of the composite metal powder and the binder resin is performed by being kneaded for 20 minutes to 1 hour.

21. The method for manufacturing conductive filler according to claim 14, further comprising the step of bringing a carbon source into contact with the surface of the composite metal powder by a CVD method to allow a carbon allotrope to grow out from the surface of the composite metal powder; and the high-temperature heat treatment step of subjecting the composite metal powder having the carbon allotrope grown out from the surface thereof, to a heat treatment at 650° C. to 950° C. under an inert gas atmosphere, after the step of subjecting the composite metal powder to a heat treatment, wherein the carbon allotrope is removed together with the carbon attaching to the surface of the composite metal powder.

22. The conductive filler according to claim 1, wherein the average particle diameter of the copper powder lies within the range of 3.0 µm to 25 µm.

* * * * *